United States Patent [19]
Klein et al.

[11] Patent Number: 6,146,954
[45] Date of Patent: Nov. 14, 2000

[54] MINIMIZING TRANSISTOR SIZE IN INTEGRATED CIRCUITS

[75] Inventors: Richard K. Klein, Mountain View; Asim A. Selcuk, Cupertino; Nicholas J. Kepler, San Jose; Craig S. Sander, Mountain View; Christopher A. Spence; Raymond T. Lee, both of Sunnyvale; John C. Holst, San Jose, all of Calif.; Stephen C. Horne, Austin, Tex.

[73] Assignee: Advanced Micro Devices, Inc., Sunnyvale, Calif.

[21] Appl. No.: 09/119,934

[22] Filed: Jul. 21, 1998

[51] Int. Cl.[7] .................................................. H01L 21/336
[52] U.S. Cl. ........................ 438/305; 438/299; 438/302; 438/306
[58] Field of Search .................................. 438/305, 299, 438/302, 306

[56] References Cited

U.S. PATENT DOCUMENTS

| | | | |
|---|---|---|---|
| 5,641,698 | 6/1997 | Lin | 438/305 |
| 5,821,146 | 10/1998 | Chang et al. | 438/299 |
| 5,940,710 | 8/1999 | Chung et al. | 438/305 |

*Primary Examiner*—Richard Elms
*Assistant Examiner*—Pho Luu
*Attorney, Agent, or Firm*—Foley & Lardner

[57] ABSTRACT

A method for fabricating a field effect transistor (FET) in and on a semiconductor substrate with local interconnects to permit the formation of minimal insulating space between polysilicon gate and the local interconnects by fabricating the source and drain of the FET and the local interconnects prior to forming the gate of the FET. A portion of an insulating layer between the source and drain is removed prior to forming the gate. Preferably, an etch stop layer on the semiconductor substrate underlying the insulating layer is used in the method.

20 Claims, 17 Drawing Sheets

MINIMIZING TRANSISTOR SIZE IN INTEGRATED CIRCUITS

FIELD OF THE INVENTION

The present invention relates to fabricating integrated circuits and, more specifically, to fabricating field effect transistors in integrated circuits with minimal insulating spacing between the gates and the local interconnects.

BACKGROUND OF THE INVENTION

With the demand for higher levels of integrated circuits of semiconductor chips, such as silicon semiconductor chips, and the need for greater density in these circuits, the spacing between the gates of field effect transistors (FET) in forming local interconnects to the source and drain of the FET, becomes more and more critical. This is specially the case with a microprocessor integrated circuit chip of which a large portion of the real estate of the chip is an SRAM. For increased performance of future microprocessor, the storage capacity of the SRAM must increase thereby requiring a larger portion of real estate of the microprocessor.

Since the field effective transistor (FET) is fabricated prior to the formation of the local interconnects, the lithographic mask design provides for additional space between local interconnect openings and the polysilicon gate to prevent accidental shorting the source and/or drain to the gate. This margin of error in the layout design wastes valuable real estate of the silicon wafer. Therefore, it would be desirable to create minimum spaced local interconnects without regard to the presence of the gate of the FET in the spaces between the local interconnects.

SUMMARY OF THE INVENTION

Accordingly, it is an object of the present invention to provide a method of fabricating an integrated circuit with minimal spacing between gates of FET and the local interconnects.

Another object of present invention is to provide an integrated circuit fabrication method in which the local interconnect can be fabricated without regard to the presence of the gates of the FETs in the spaces between the local interconnects.

A further object of the present invention is to provide an integrated circuit fabrication method in which the fabrication of the local interconnects control the fabrication spacing of the gate.

In accordance with the present invention, an integrated circuit semiconductor substrate is fabricated by first forming the local interconnects to the source and drain of an FET prior to the formation of the gate. The fabrication method comprising the steps of: forming on a semiconductor substrate a thick insulating layer; forming spaced apart openings in the insulating layer for creating a source and drain; filling each of said openings with a conductive material to form local interconnects; removing the portion of the insulating layer between the local interconnects to form an opening; forming a gate oxide on the semiconductor substrate in the opening; and forming a gate on the gate oxide and between the local interconnects. Preferably, an etch protective or stop layer is formed on the semiconductor substrate before forming the thick insulating layer. In addition, the conductive material for forming the local interconnects can be the origin of impurities for the source and drain or, preferably, the impurities can be implanted by using the portion of the insulating layer as mask for self aligning the implantation.

Further, an insulating space is created between the local interconnects and the gate in forming the gate. The space between the pair of local interconnects is one minimum lithographic feature and the each of the local interconnects are each one minimum lithographic feature so that the FET is not greater than three minimum lithographic features.

BRIEF DESCRIPTION OF THE DRAWINGS

The foregoing and other objects, aspects and advantages will be better understood from the following detailed description of a preferred embodiments of the invention with reference in the drawings, in which:

FIG. 1 is a cross-sectional view of a portion of a semiconductor substrate with field oxidation areas in the portion of the substrate and spaced from each other and having an active region in between.

DETAILED DESCRIPTION OF THE PREFERRED EMBODIMENTS OF THE INVENTION

Figure 1:
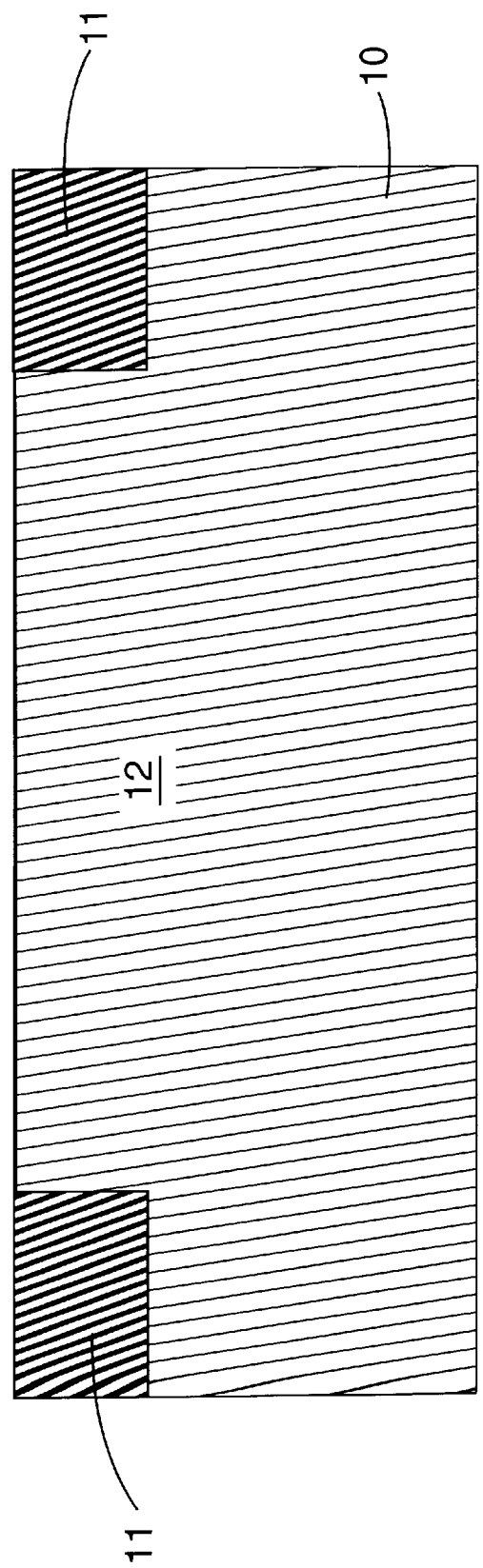
Figure 6:
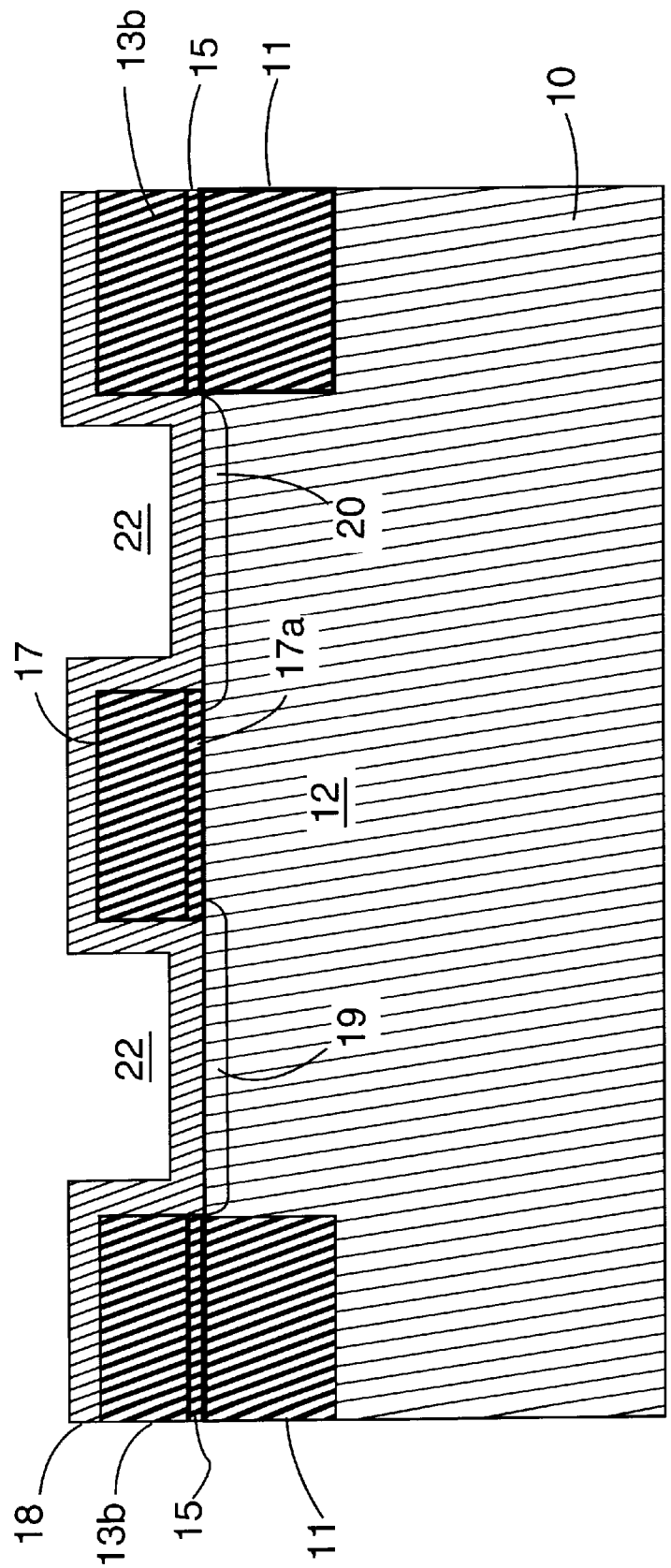
FIG. 6 is a cross-sectional view of the portion of the semiconductor substrate with of FIG. 5 with a conformal layer of doped polysilicon deposited on the insulating layer and in the openings and the creation of a source and a drain.

Referring now to the drawings of FIGS. 1–15, FIG. 1 shows a cross-sectional view of a portion of a semiconductor wafer, which is a silicon substrate 10 having field isolation 11, herein shallow trenches, formed in the substrate on opposite sides of an active area 12 on and in which a field effect transistor (FET) is to be formed. Prior to forming the FET, a thick insulating material 13a is deposited on the semiconductor substrate 10 with a region in the center between the two trenches 11 as shown by dashed lines 14 in FIG. 2a. Preferably, an etch protective or stop layer 15 deposited on the substrate 10 as shown in FIG. 2b before depositing the thick insulating layer 13b as shown in FIG. 3. The etch selectivity properties of the etch stop layer 15 are different from the etch selectivity of the insulating layer 13b. After the layers 13b and 15 are formed by deposition, a mask pattern (not shown) is used to remove portions of the layers 13b and 15 and to form openings 16 by etching with a first etchant which is more selective for the layer 13b than layer 15 so that the etching stops upon reaching layer 15. A second etchant, which is more selective for layer 15 than either layer 13b and the silicon substrate 10, is then used so that the etching stops upon reaching the substrate 10. Portions 17 and 17a of the insulating layer 15b and the etch stop layer 15, respectively, remain in the active region 12 after forming the openings 16. To form a source and drain, a conformal conductive layer 18 is deposited on the layers 13b and 17 and in the openings 16. By outdiffusing the impurities into the substrate, a source 19 and drain 20 are formed as shown in FIG. 6.

Figure 7A:
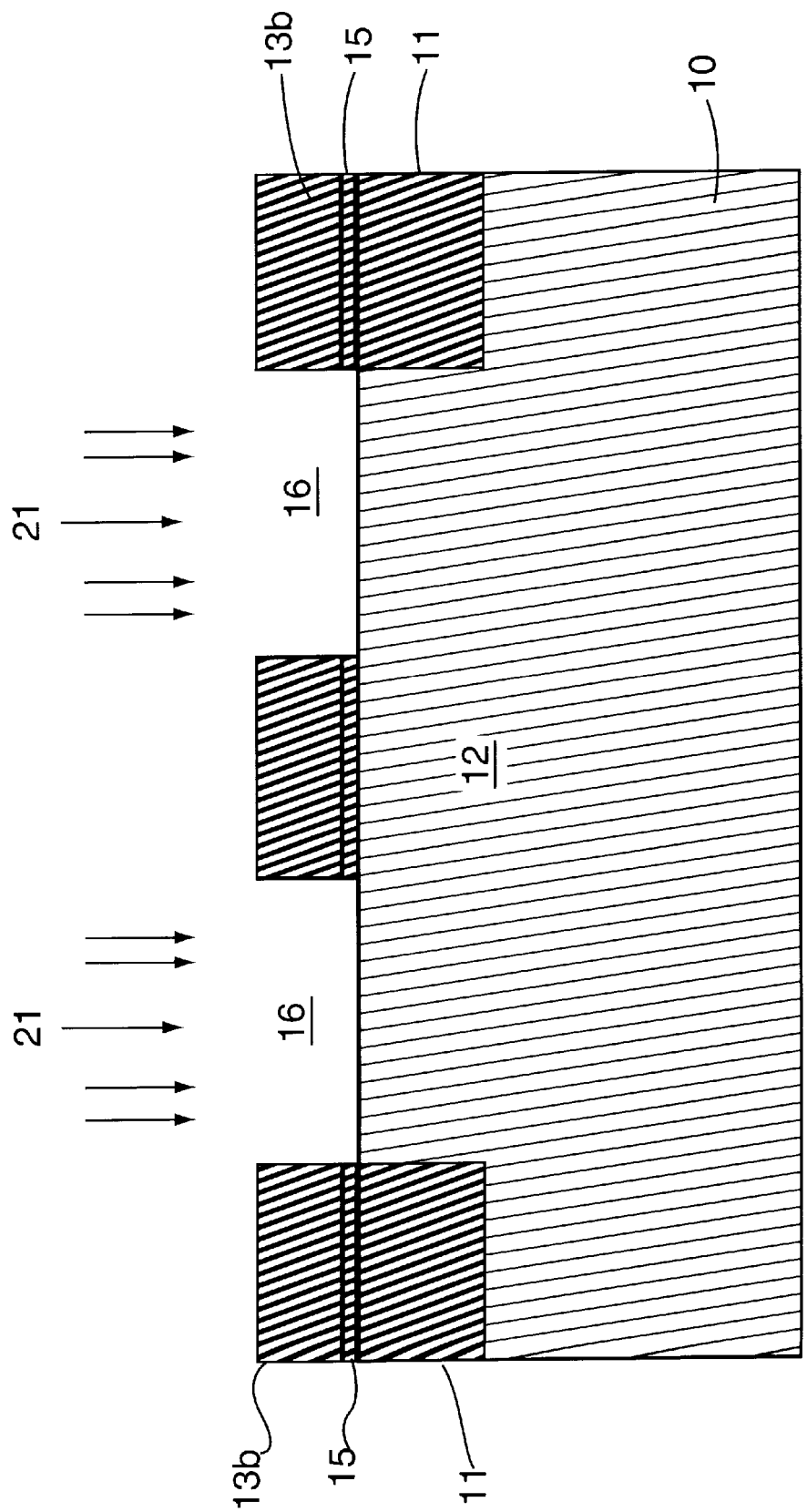
FIG. 7a is a cross-sectional view of the portion of the semiconductor substrate of FIG. 5 showing implantation of impurities for creating a source and drain.
Figure 7B:
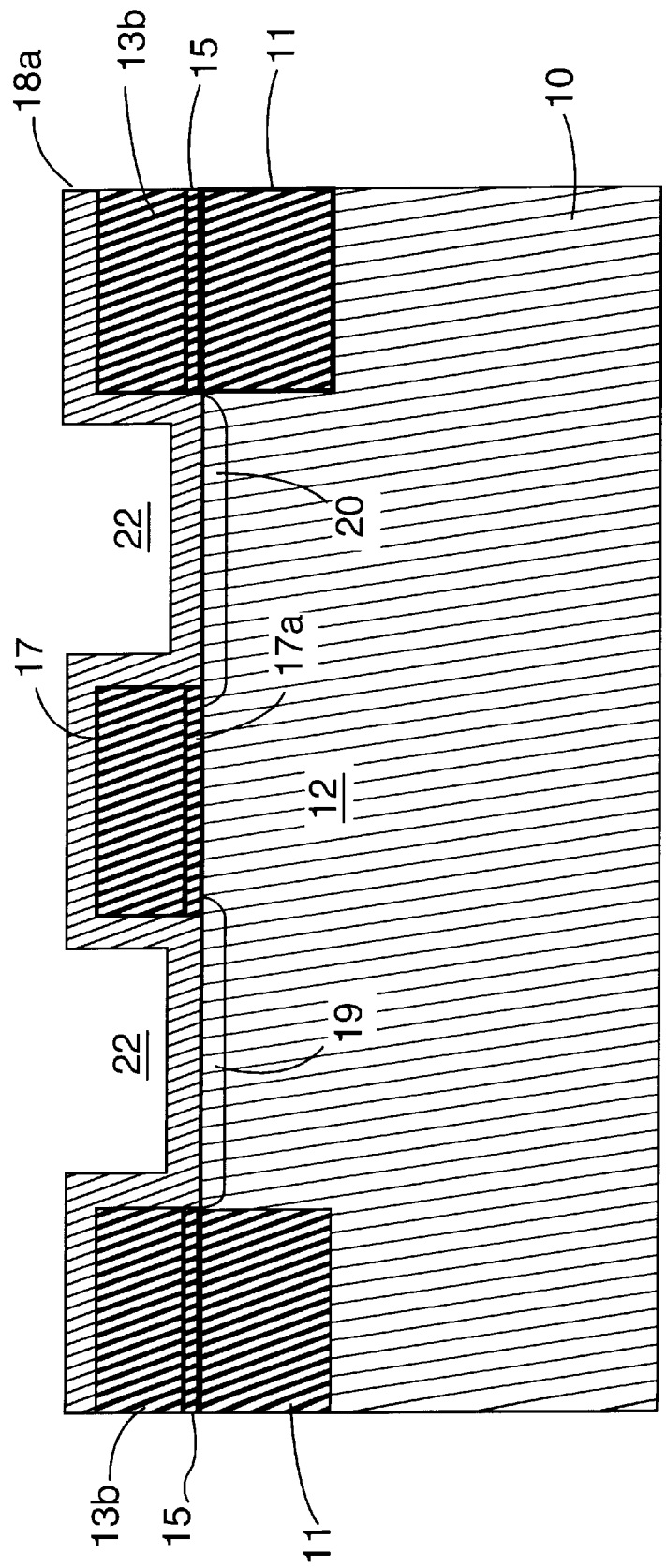
FIG. 7b is a cross-sectional view of the portion of the semiconductor substrate of FIG. 7a showing the implanted impurities annealed and a conformal conductive layer deposited on the insulating layer and lining the openings.
Figure 8:
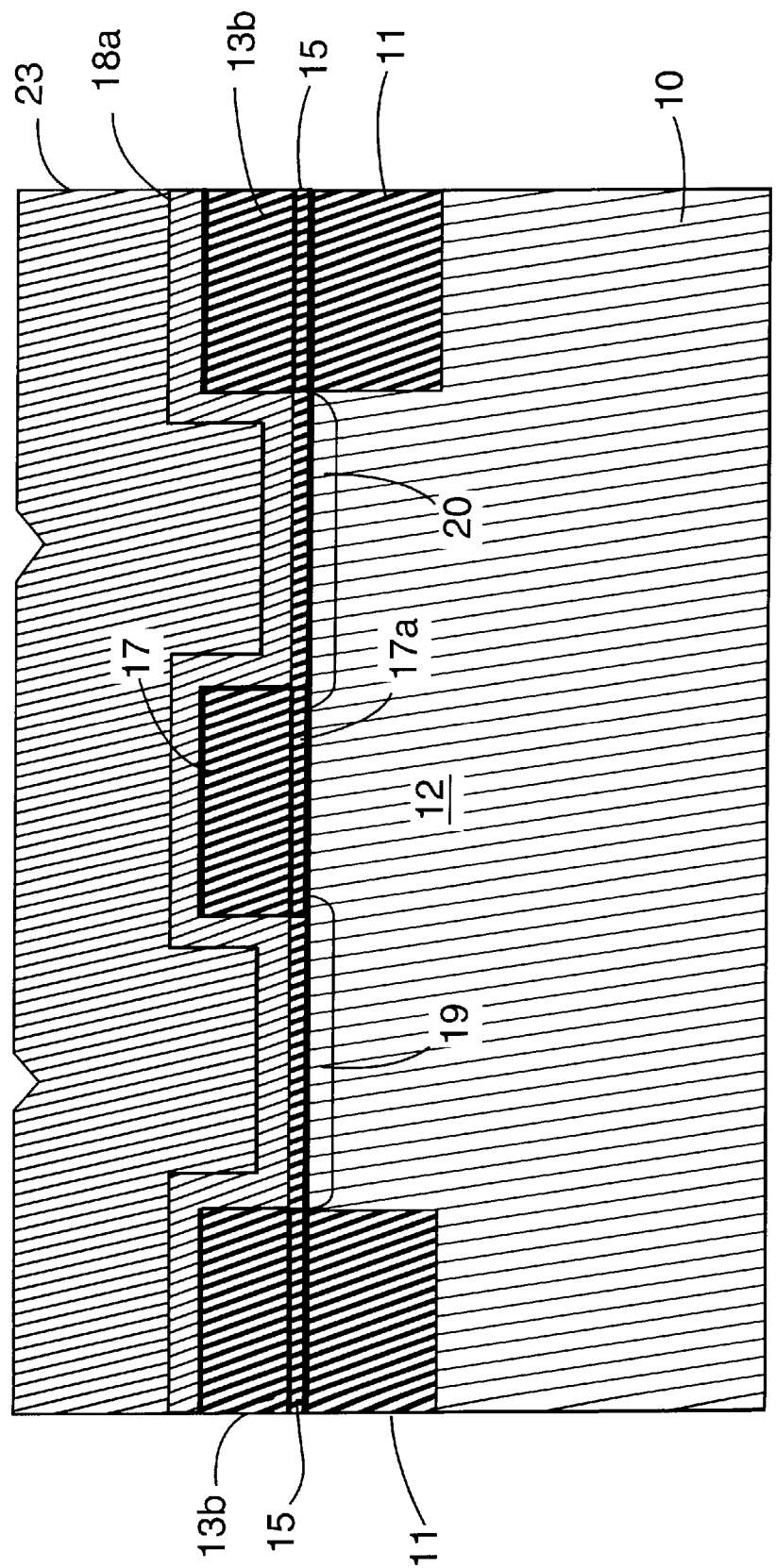
FIG. 8 is a cross-sectional view of the portion of the semiconductor substrate of either FIG. 6 or FIG. 7b with a conductive material deposited on the conformal layer and filling the lined openings.
Figure 9:
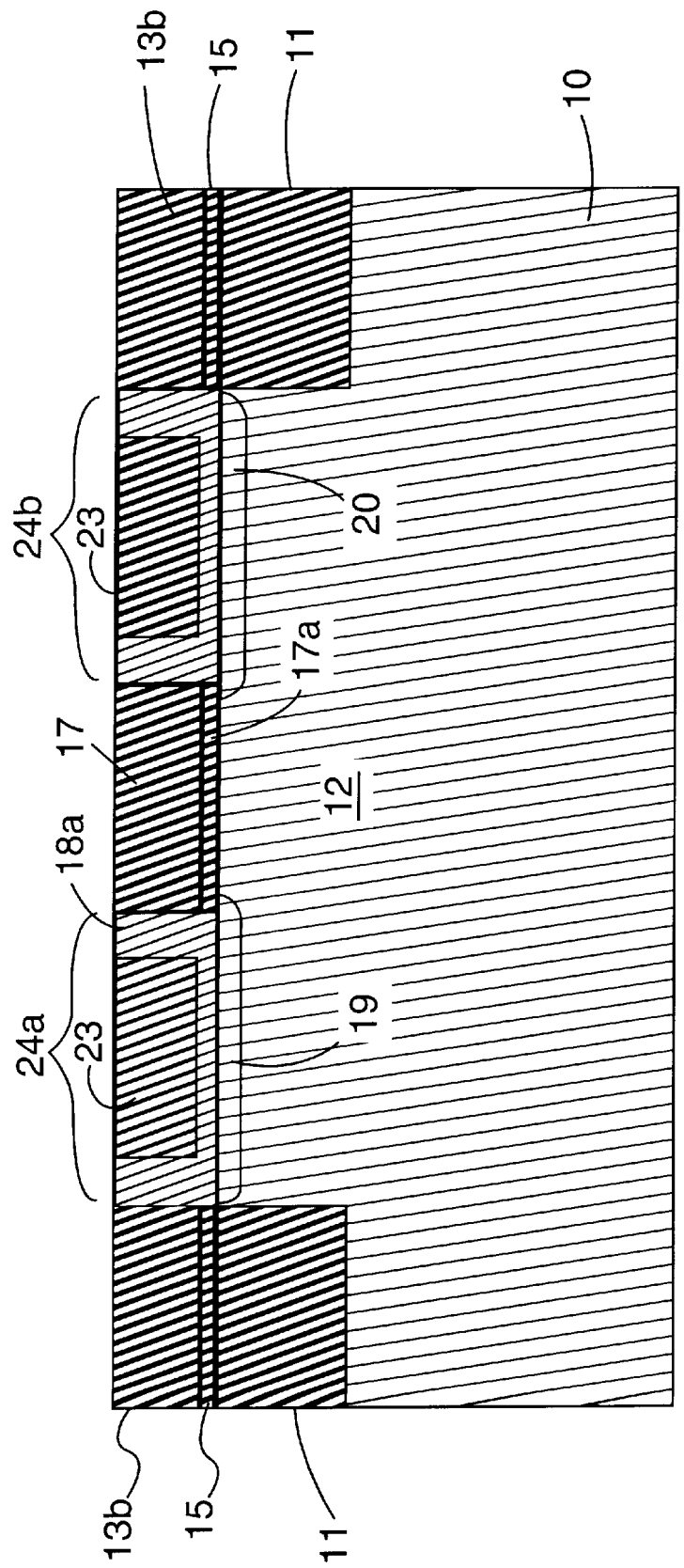
FIG. 9 is a cross-sectional view of the portion of the semiconductor substrate of FIG. 9 with the conductive material and the conformal layer planarized level with the surface of the insulating layer.

Preferably, impurities are implanted as shown by the arrows 21 using the portion 17 of the insulating layer 13b as a alignment mask to form the source 19 and drain 20 before depositing the conformal layer 18 as shown in FIG. 7a. After implantation, conformal conductive layer 18a is deposited and the substrate is annealed using rapid thermal anneal (RFT) to activate and diffuse the impurities as shown in FIG. 7b. To completely fill the remaining openings 22 for the local interconnects, another conductive material 23 is deposited in the openings 22 as shown in FIG. 8. The conductive material 23 and layer 18a are planarized so as to be level with insulating layers 13b and 17 as shown in FIG. 9 to form local interconnects 24a and 24b.

Figure 10:
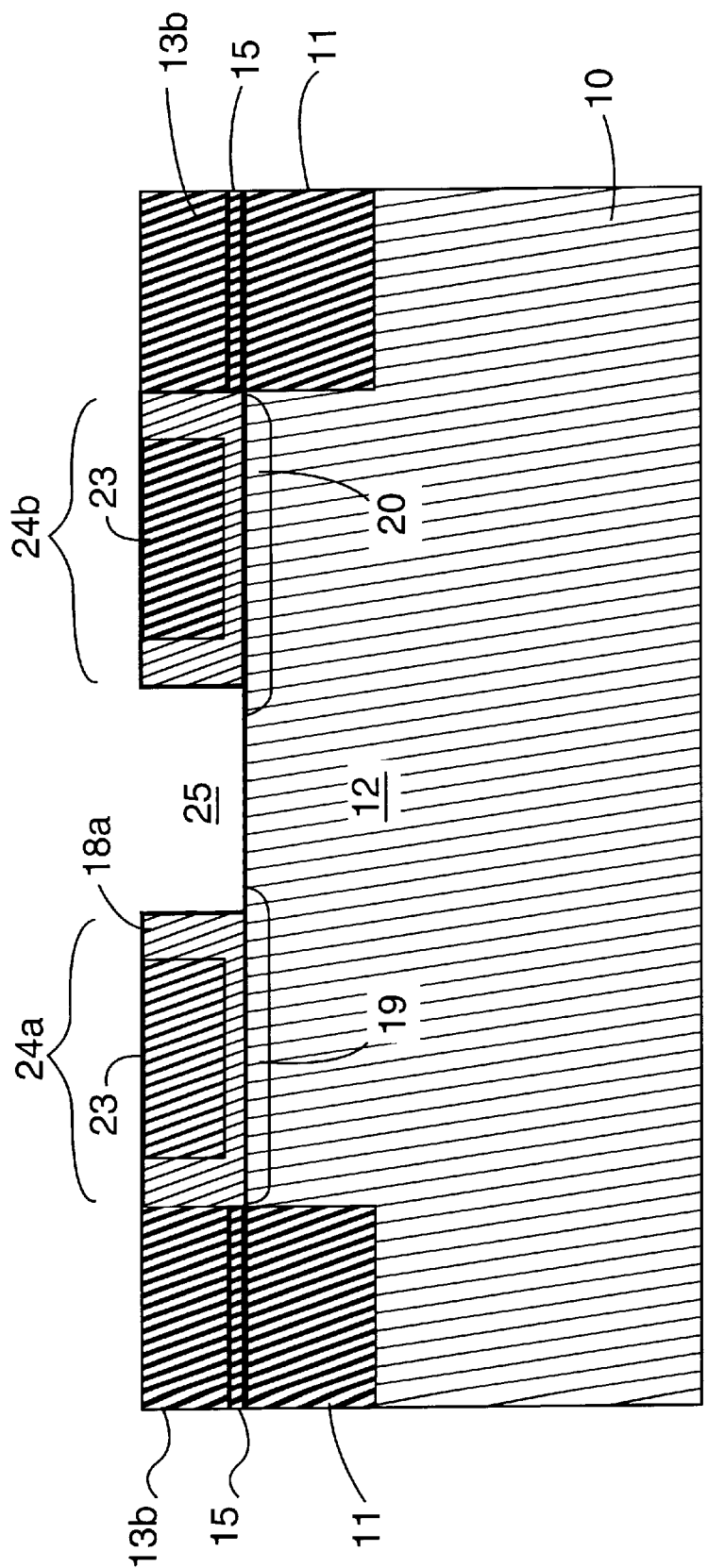
FIG. 10 is a cross-sectional view of the portion of the semiconductor substrate of FIG. 10 with the insulating layer in the subsequent gate region removed leaving an opening in the gate region.
Figure 11:
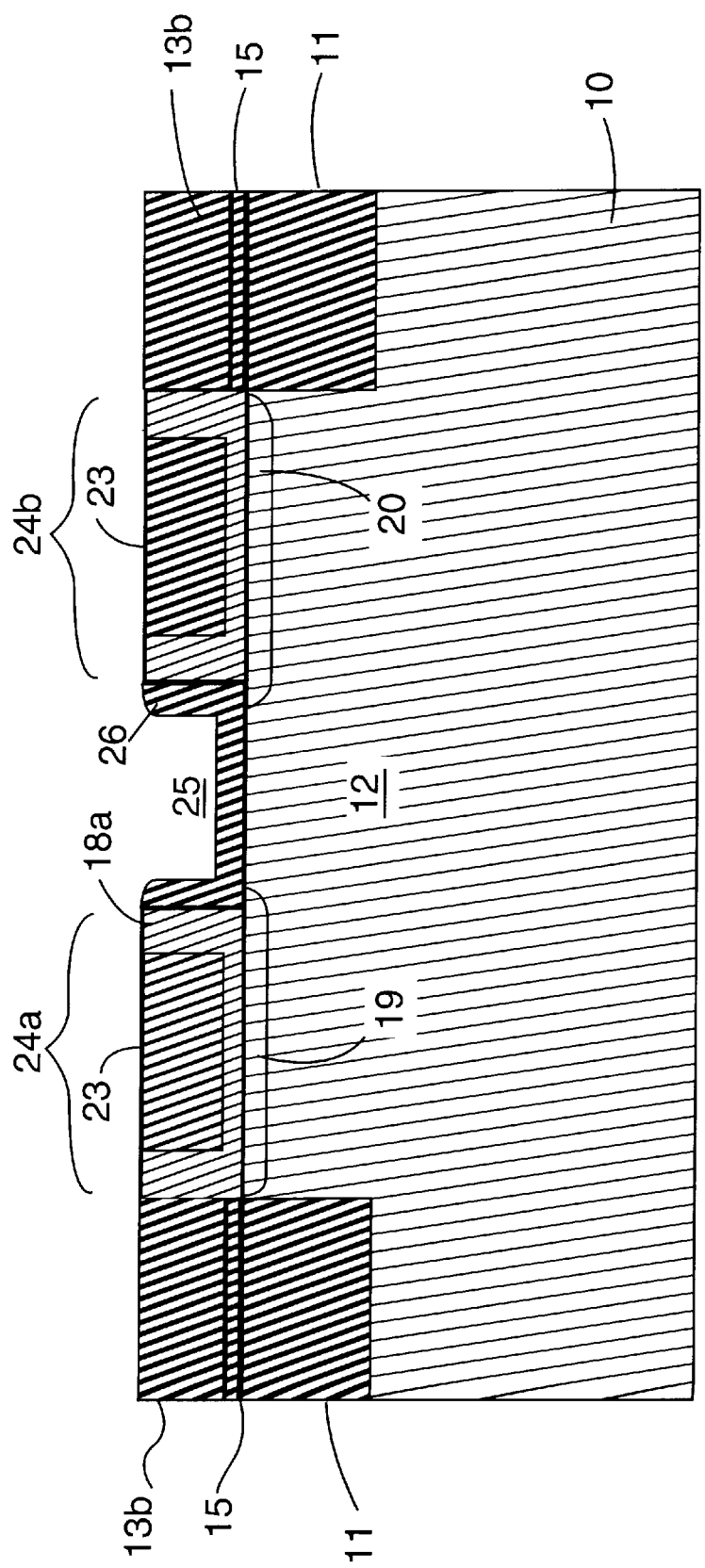
FIG. 11 is cross-sectional view of the portion of the semiconductor substrate of FIG. 10 with an conformal insulating layer deposited in the opening.
Figure 12:
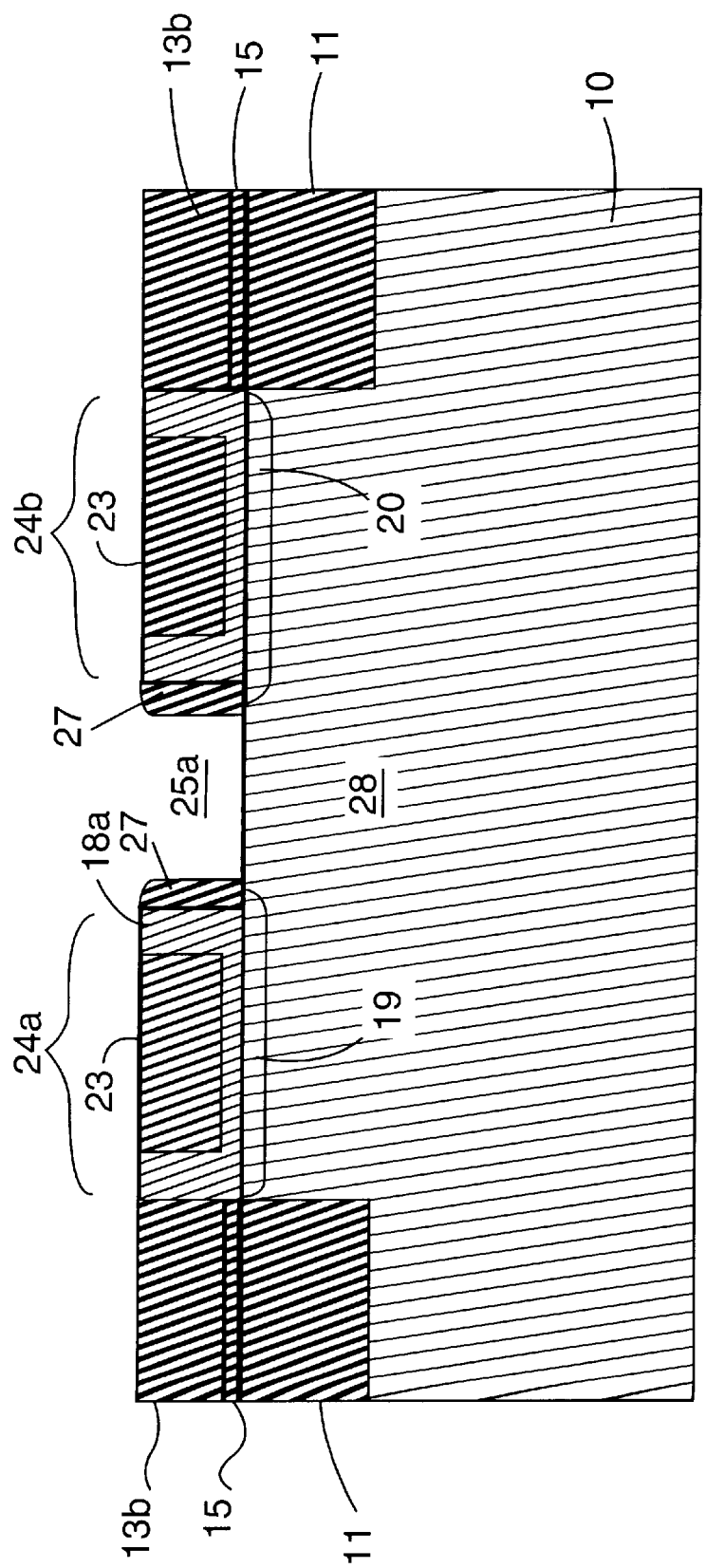
FIG. 12 is cross-sectional view of the portion of the semiconductor substrate of FIG. 11 with an conformal insulating layer anisotropically etched to form sidewalls in the opening.
Figure 13:
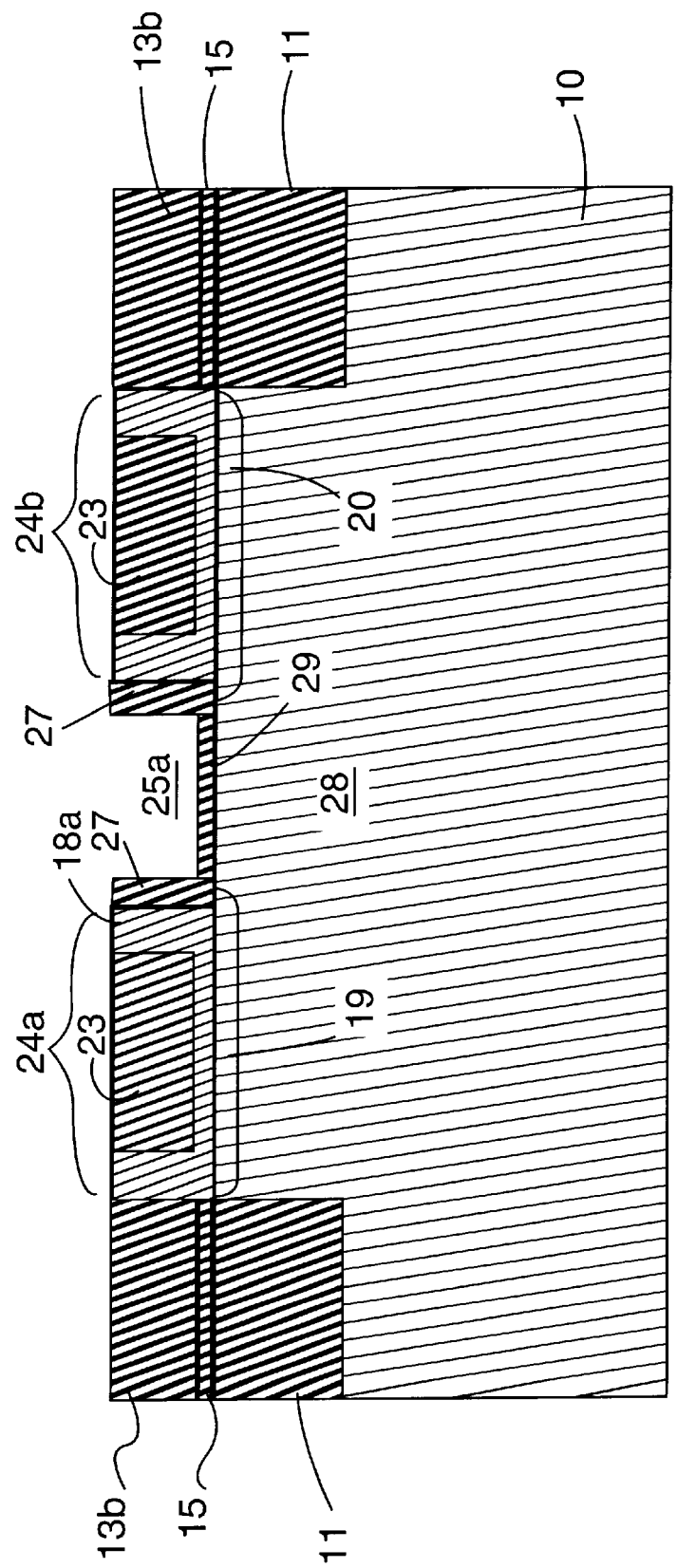
FIG. 13 is cross-sectional view of the portion of the semiconductor substrate of FIG. 12 with gate oxide grown on the surface of the semiconductor substrate in the gate region.

In FIG. 10, the layers 17 and 17a are removed to form opening 25 by masking all but the layer 17 and anisotropically etching the layer 17. The etch stop layer 17a also is removed. Now, a thin insulating layer 26 from a conformal source is deposited on the walls of the opening 25 as shown in FIG. 11. After deposition of the layer 26, the layer is anisotropically etched to remove the layer 26 at the bottom of the opening 25 and form insulating sidewalls 27 abutting the local interconnects 24a and 24b and separated by an opening 25a over area 28 to be the channel region of the FET as shown in FIG. 12. With the silicon substrate 10 now exposed at the bottom of the opening 25, a gate oxide layer 29 is thermally grown on the bottom of the opening 25a as shown in FIG. 13.

Figure 14:
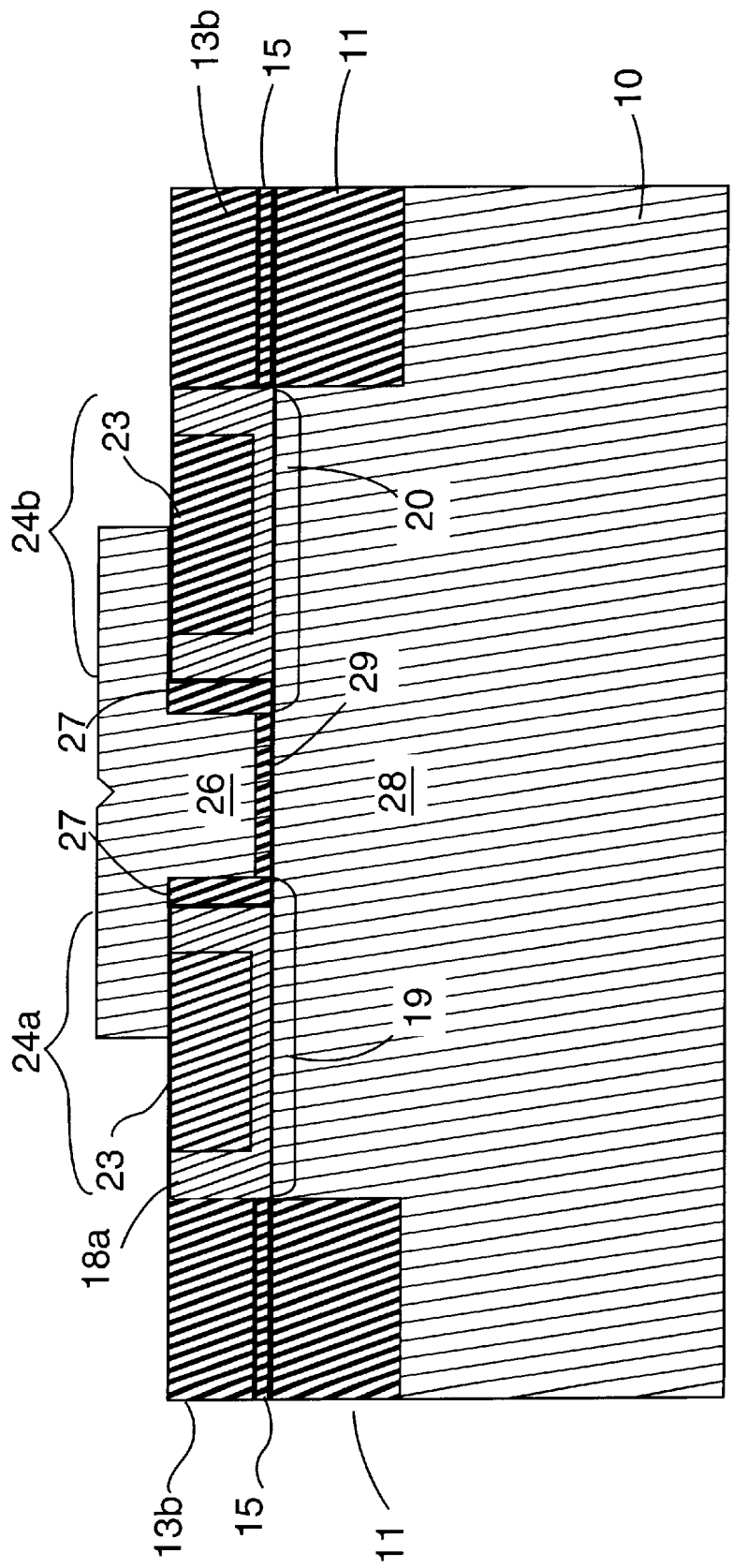
FIG. 14 is cross-sectional view of the portion of the semiconductor substrate of FIG. 13 with a conductive material deposited in the opening on the gate oxide.
Figure 15:
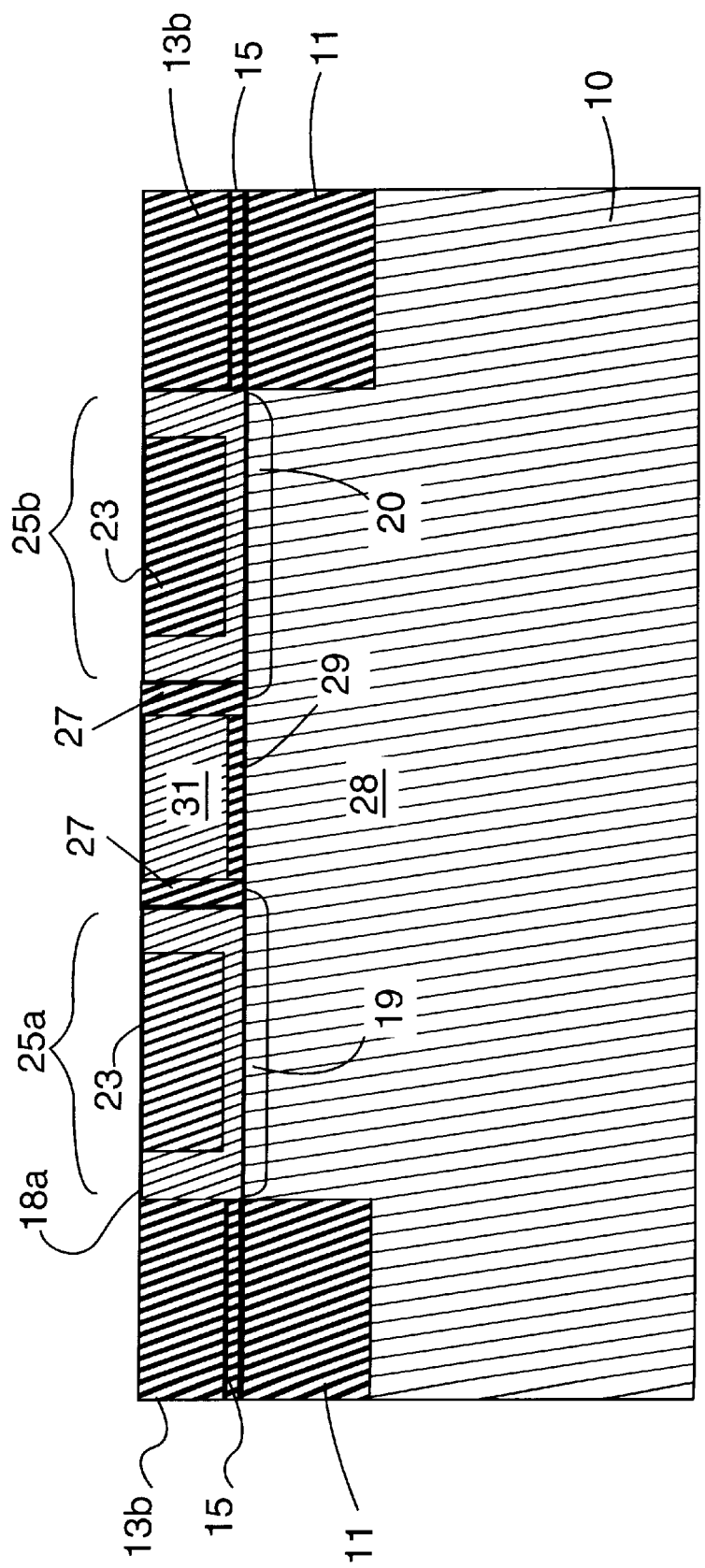
FIG. 15 is cross-sectional view of the portion of the semiconductor substrate of FIG. 14 with the conductive material planarized level with the insulating layer and local interconnects.

Since the source 19, drain 20 and gate oxide 29 are now fabricated, only the gate remains to complete the FET. A gate material 30 is deposited, as shown in FIG. 14, in the opening 25a and on the gate oxide layer 29. The surface of the gate material 30 is planarized level with the local interconnects 24a and 24b and the insulating layer 13a or 13b, depending on the embodiment, to complete the FET transistor with gate 31.

To achieve a minimal size transistor, the desired lithographic pattern size is established and defined as a minimum feature. The spacing between the openings 16 for the source 19 and drain 20 is one minimum feature and the openings 16 are each one minimum feature so the total width of the transistor is three minimum features. For example, it the desired lithographic pattern size is 0.35 $\mu$m, the size of the transistor would be 1.05 $\mu$m.

To supplement the above general description of the present invention, a detailed description of the steps of the present invention will now be given. As shown in FIG. 1, the silicon substrate 10 with a {100} plane orientation is doped with an appropriate impurity depending on whether the FETs are to be N-type or P-type. If the FETs are to be complementary N-type and P-type, such as a complementary metal oxide silicon (CMOS) FET, selected portions of the substrate 10 will be doped with an appropriate impurity to form wells in the complementary areas. To simplify the description of the present invention, the embodiments of the integrated circuit is an N-type FET and the substrate 10 is doped with a P-type impurity, herein boron (B). Field isolation 11 are formed on both sides of an active region 12 for the transistor. Herein, the field isolation 11 are shallow trenches fabricated by etching a groove in the silicon substrate followed by depositing silicon oxide in the groove and planarizing the surface of the substrate. If desired the walls of the groove in the silicon substrate can be thermally oxidized to form a high quality oxide liner on the walls of the groove before depositing the silicon oxide. Low pressure chemical vapor deposition (LPCVD) with tetraethylorthosilicate (TEOS) as the source at a temperature of 650 to 750° C. is the preferred method of deposition.

Figure 2A:
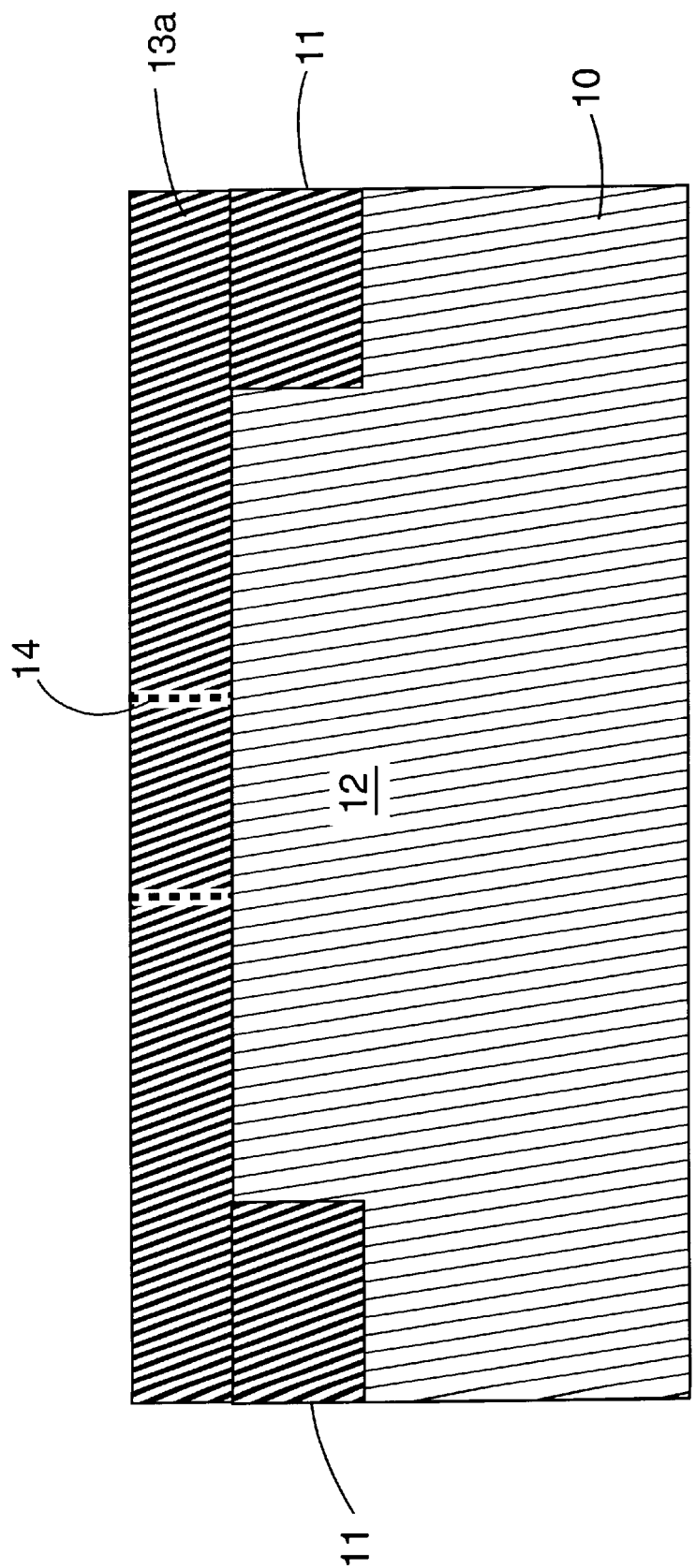
FIG. 2a is a cross-sectional view of the portion of the semiconductor substrate of FIG. 1 showing a thick insulating layer on the substrate.
Figure 2B:
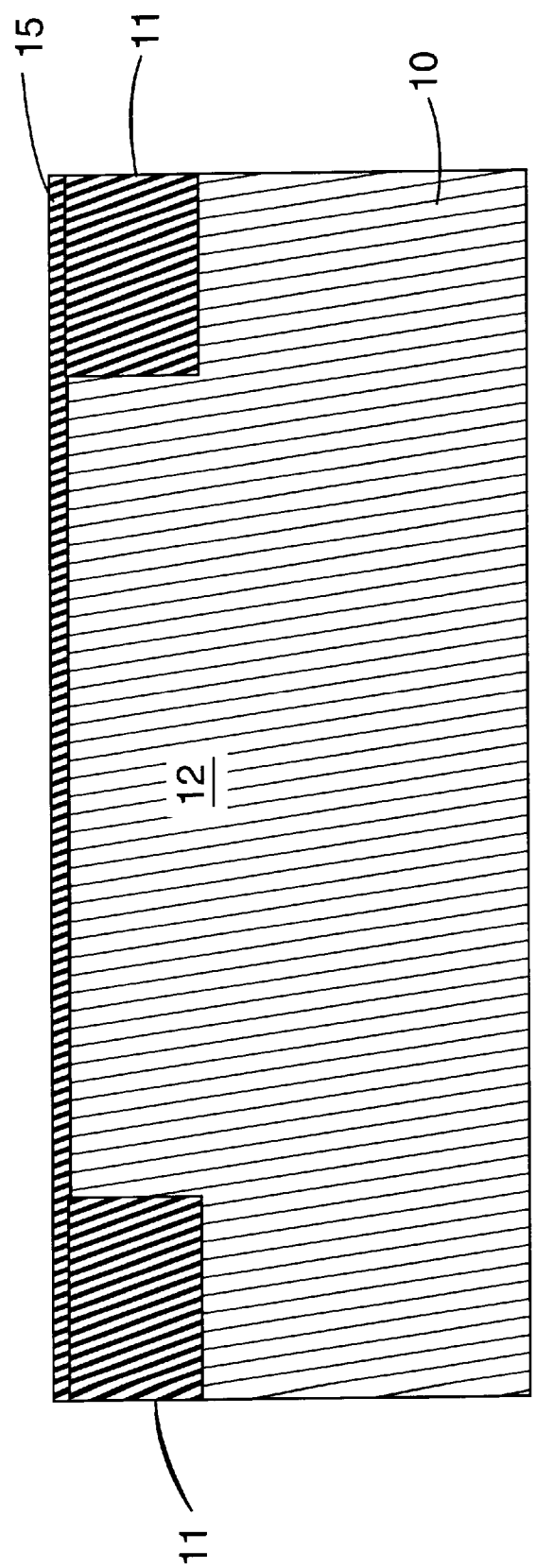
FIG. 2b is a cross-sectional view of the portion of the semiconductor substrate of FIG. 1 showing an etch protective or stop layer on the substrate.
Figure 3:
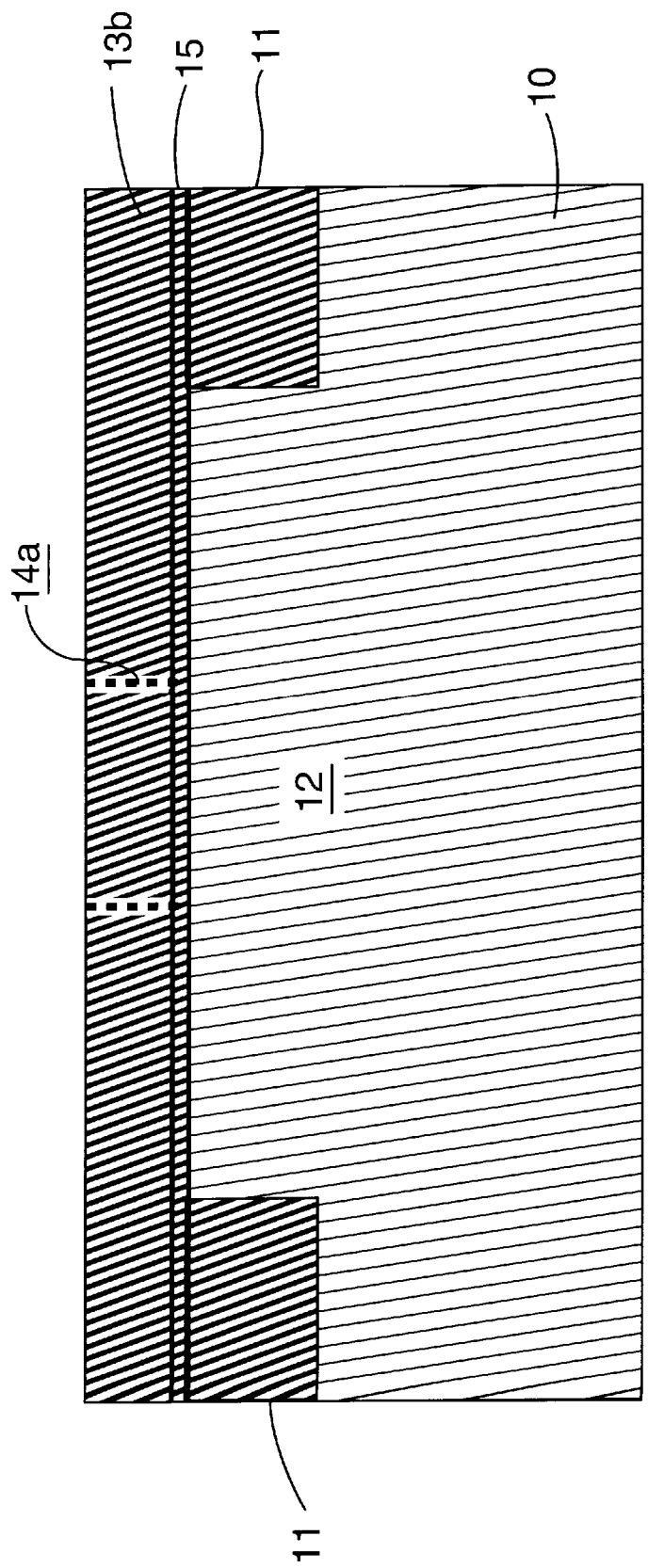
FIG. 3 is a cross-section view of the portion of the semiconductor substrate of FIG. 2b with a thick insulating layer on the etch protective or stop layer.
Figure 4:
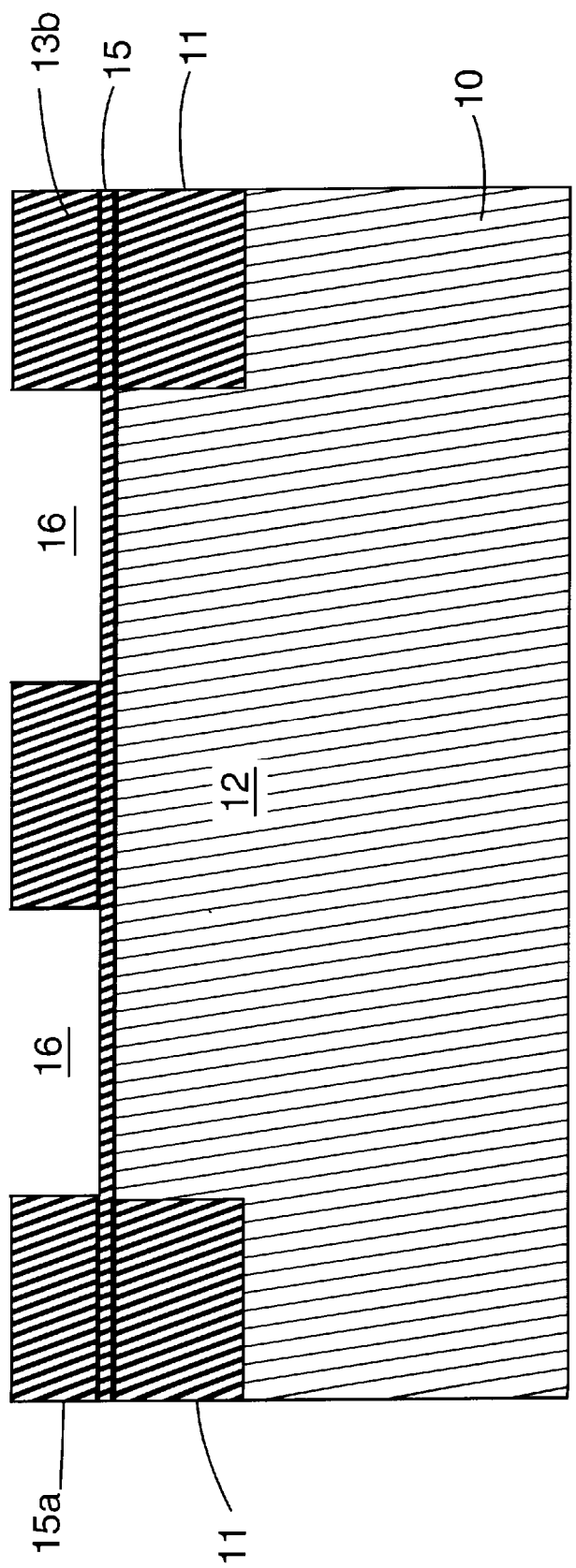
FIG. 4 is a cross-sectional view of the portion of the semiconductor substrate of FIG. 3 with openings for local interconnects in the insulating layer.
Figure 5:
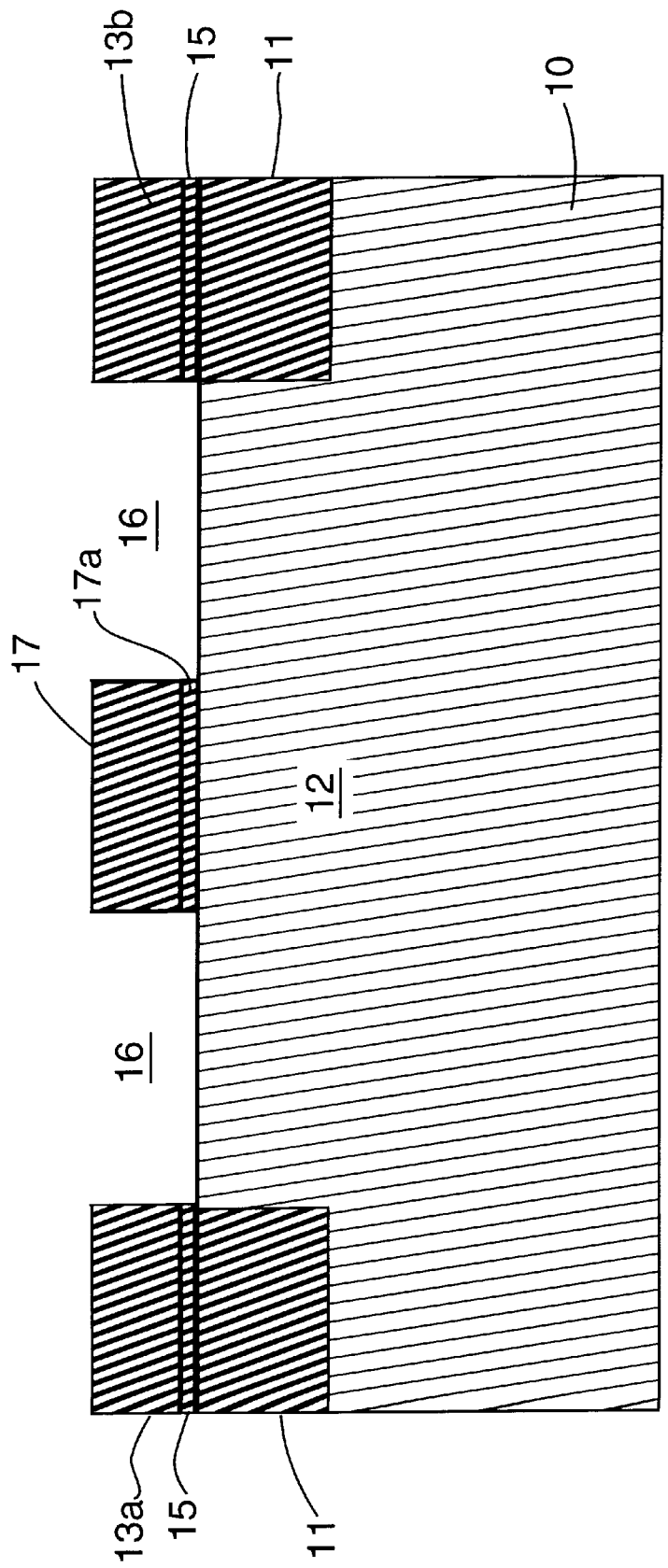
FIG. 5 is a cross-sectional view of the portion of the semiconductor substrate of FIG. 4 with openings for the local interconnects in the etch protective or stop layer.

Prior to forming the FET in the active region 12, herein a N-type FET, a thick insulating layer 13a is deposited on the semiconductor substrate 10 with a sacrificial portion shown in FIG. 2a by dashed lines 14 in the center between the two trenches 11. Preferably, the material of the insulating layer 13a is silicon oxide (SiO$_2$) and ranges in thickness from 2000 Å to 10000 Å, herein 6000 Å. The layer 13a is deposited using chemical vapor deposition (CVD) of silane (SiH$_4$) and oxygen (O$_2$) at 650–750° C. and is planarized using chem/mech polishing with a commercial slurry as shown in FIG. 2a. An etch protective or stop layer 15 preferably is deposited on the substrate 10 as shown in FIG. 2b before a thick insulating layer 13b is deposited. Herein, the etch stop layer 15 is silicon nitride (Si$_3$N$_4$ or SiN) or, alternatively, silicon oxynitride (SiO$_x$N$_4$) in the range of 500 Å to 2000 Å, herein 1000 Å, and is LPCVD deposited using dichlorosilane (SiCl$_2$H$_2$) and ammonia (NH$_3$) at 700–800°. A sacrificial portion of the etch stop layer 15 is shown by the dashed lines 14a. The etch selectivity properties of the etch stop layer 15 are different from the etch selectivity of the insulating layer 13b, which is deposited in the same manner and of the same thickness as layer 13a. Layer 13b also is planarized using chem/mech polishing with a commercial slurry as shown in FIG. 3.

After the layers 13b and 15 are formed, a photographic mask pattern (not shown) is used to create openings 16 by removing portions of the layers 13b and 15 by first etching with a etchant more selective for the layer 13b than layer 15. Herein, openings 16 are formed by anisotropically etching the silicon oxide of the layer 13b in a parallel plate reactive ion etcher with a plasma gas of silicon tetrafluoride ($SiH_4$) and hydrogen ($H_2$), which is more selective for silicon oxide of layer 13b than the silicon nitride of the etch stop 15 so that the etching stops upon reaching layer 15. Using the same reactor but with a plasma gas of silicon tetrafluoride and oxygen which is more selective for silicon nitride than silicon oxide, the etch stop layer is removed to complete the openings 16. The etching stops at the surface of the silicon substrate 10 leaving layers 17 and 17a over the active region 12. One alternative to form a source and drain is to use a conformal conductive layer 18, herein polysilicon doped with impurities of arsenic (As). The layer 18 is deposited on the layers 13b and in the openings 16 and, by outdiffusing the arsenic impurities into the substrate, the source 19 and drain 20 are formed as shown in FIG. 6. The doped polysilicon is deposited in situ using silane ($SiH_4$) and arsine ($AsH_3$).

Preferably, to form the source 19 and drain 20, impurities, herein arsenic, as shown by the arrows 21, are implanted using the portion 17 of the insulating layer 13b as an alignment mask before depositing a conformal layer 18a as shown in FIG. 7a. After implantation, the conformal conductive layer 18a of about 200 Å in thickness is deposited by LPCVD using silane and phosphine at a temperature in the range 580° C. and the substrate is annealed using rapid thermal anneal (RFT) to activate and diffuse the impurities. The layer 18a now lines the walls and bottom of the opening 16 and leaves openings 22 as shown in FIG. 7b. To completely fill the remaining openings 22 for the local interconnects, another conductive material 23 is deposited in the openings 22, such as tungsten (W), as shown in FIG. 8, which is LPCVD deposited from tungsten hexafluoride ($WF_6$) with hydrogen at a temperature in excess of 600° C. At the interface of the polysilicon and the tungsten, tungsten silicide ($WSi_2$) forms. Alternatively, the initial openings 16 can be filled with tungsten having a thin barrier layer of titanium and/or titanium nitride or, alternatively, copper (Cu) or aluminum (Al) with appropriate barrier liners can be used as are well known in the art. After the deposition of the tungsten, the tungsten 23 and the polysilicon 18a on the surface of the insulating layer 13b are removed by planarization using chem/mech polishing with a commercial slurry, as shown in FIG. 9, to form local interconnects 24a and 24b to the source 19 and drain 20, respectively and separated by layers 17 and 17a.

If desired, a metal silicide (not shown), such as titanium silicide ($TiSi_2$), can be formed in the bottom of the initial openings 16 and in contact with the silicon substrate 10 at the source 19 and drain 20. A number of known methods exist in the art to form such metal silicides.

Next, as shown in FIG. 10, the layer 17 and layer 17a are removed to form opening 25 by masking all but the layer 17 with a photolithographic resin (not shown) and anisotropically etching the silicon oxide of the layer 17 in parallel plate reactive ion reactor with a plasma gas of silicon tetrafluoride and hydrogen, which is more selective for silicon oxide of layer 17 than the polysilicon 18a of the local interconnects. Without removing the resist mask (not shown), the etch stop layer 17a is removed using a gas mixture of silicon tetrafluoride and oxygen. Now, a thin insulating layer 26 from a conformal source is deposited on the walls of the opening 25 as shown in FIG. 11. Herein, the insulating layer 26 is silicon oxide and is deposited by LPCVD using TEOS at a temperature in the range of 650 to 750° C. The thickness of the layer 26 is about 500 Å. After deposition of the layer 26, the layer is anisotropically etched, using the same reactor and gas which was used to remove the layers 17 and 17a, to remove the portion of the layer 26 at the bottom of the opening 25 and form insulating sidewalls 27 abutting the local interconnects 24a and 24b and separated by an opening 25a over area 28 which will become the channel region of the FET as shown in FIG. 12. With the silicon substrate 10 now exposed at the bottom of the opening 25a, a gate oxide layer 29 is thermally grown on the bottom of the opening 25a as shown in FIG. 13, using the silicon substrate as the source of silicon. The layer 29 is grown in an oven in the temperature range of 780 to 980° C. in dry oxygen to a thickness of about 80 Å.

Since the source 17, drain 18 and gate oxide 29 are now fabricated, only the gate remains to complete the N-type FET. Polysilicon 30 is the preferred gate material and it is deposited, as shown in FIG. 14, in the opening 25a and on the gate oxide layer 29 by LPCVD using silane and phosphine at a temperature range of 580 to 650° C. The phosphine provides in situ doping of the polysilicon with an N-type impurity to increase the conductivity of the polysilicon. To planarize the surface, the polysilicon 30 is chem/mech polished using a commercial slurry, level with the local interconnects 24a and 24b and the insulating layer 13a or 13b, depending on the embodiment, to complete the FET transistor with gate 31. To finish the fabrication of an integrated circuit with the FET of FIG. 15, multilevel conductive lines and vias (not shown) separated by insulating layers (not shown) are used to connect the local interconnects 24a and 24b and the gate 31 with other FETs and passive components of the integrated circuit as is well know in the art and will not be described here.

Although this invention has been described relative to specific materials, and apparatuses for depositing and etching these materials, it is not limited to the specific materials or apparatuses but only to their specific characteristics. Other materials and apparatus can be substituted for those described herein which will be well understood by those skilled in the microelectronics and semiconductor arts after appreciating the present invention.

Having thus described the invention, what is claimed is:

1. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of said openings and a drain in the other of the openings;

filling each of said openings with a conductive material to form local interconnects to the source and drain;

removing a portion of said insulating layer to form a gate opening between the local interconnects;

forming a gate oxide on the semiconductor substrate in the gate opening; and forming a gate on the gate oxide in gate opening between the local interconnects wherein the space between the pair of openings is one minimum lithographic feature and the local interconnects are each one minimum lithographic feature.

2. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of said openings and a drain in the other of the openings;

filling each of said openings with a conductive material to form local interconnects to the source and drain;

removing a portion of said insulating layer to form a gate opening between the local interconnects;

forming a gate oxide on the semiconductor substrate in the gate opening; and forming a gate on the gate oxide in gate opening between the local interconnects wherein insulating spacers are formed from a conformal insulating layer in the gate opening on each of the local interconnects.

3. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of said openings and a drain in the other of the openings;

filling each of said openings with a conductive material to form local interconnects to the source and drain;

removing a portion of said insulating layer to form a gate opening between the local interconnects;

forming a gate oxide on the semiconductor substrate in the gate opening; and forming a gate on the gate oxide in gate opening between the local interconnects wherein the source and drain are formed by implanting impurities in the pair of openings in the insulating layer.

4. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of said openings and a drain in the other of the openings;

filling each of said openings with a conductive material to form local interconnects to the source and drain;

removing a portion of said insulating layer to form a gate opening between the local interconnects;

forming a gate oxide on the semiconductor substrate in the gate opening; and forming a gate on the gate oxide in gate opening between the local interconnects wherein the portion of insulating material is removed by using a masking material with an opening in the masking material positioned between said pair of local interconnects.

5. The method of claim 4 wherein the opening in the masking material extends over but not beyond each of the pair of local interconnects.

6. The method of claim 5 wherein openings in the insulating material are positioned over active regions in the semiconductor substrate and the opening in masking material extends to or beyond the active region on sides of the opening removed from the local interconnects.

7. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of said openings and a drain in the other of the openings;

filling each of said openings with a conductive material to form local interconnects to the source and drain;

removing a portion of said insulating layer to form a gate opening between the local interconnects;

forming a gate oxide on the semiconductor substrate in the gate opening; and forming a gate on the gate oxide in gate opening between the local interconnects wherein a conductive layer is formed on the walls of the local interconnect openings to line the opening and the remainder of the local interconnect opening is filled with another conductive material.

8. The method of claim 7 wherein the conductive liner is polysilicon and the other conductive material is tungsten.

9. The method of claim 8 wherein the polysilicon is the origin for the impurities for the source and drain.

10. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of said openings and a drain in the other of the openings;

filling each of said openings with a conductive material to form local interconnects to the source and drain;

removing a portion of said insulating layer to form a gate opening between the local interconnects;

forming a gate oxide on the semiconductor substrate in the gate opening; and forming a gate on the gate oxide in gate opening between the local interconnects wherein a barrier layer is formed on the walls of the local interconnect openings to line the opening and the remainder of the local interconnect opening is filled with a conductive material.

11. The method of claim 10 wherein the barrier layer includes titanium nitride.

12. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of said openings and a drain in the other of the openings;

filling each of said openings with a conductive material to form local interconnects to the source and drain;

removing a portion of said insulating layer to form a gate opening between the local interconnects;

forming a gate oxide on the semiconductor substrate in the gate opening; and forming a gate on the gate oxide in gate opening between the local interconnects wherein an insulating etch stop layer is formed on semiconductor substrate before forming the thick insulating layer.

13. The method of claim 12 wherein the etch selectivity of the etch stop layer is different from the etch selectivity of the insulating layer.

14. The method of claim 13 wherein the etch stop layer is a nitride of silicon.

15. A method of fabricating at least a pair of local interconnects with one interconnect on each side of a gate of a field effect transistor (FET) in an integrated circuit on a semiconductor substrate comprising the steps of:

forming on a semiconductor substrate a thick insulating layer;

forming at least a pair of spaced apart openings in the insulating layer adjacent the semiconductor substrate;

forming a source in one of said openings and a drain in the other of the openings;

filling each of said openings with a conductive material to form local interconnects to the source and drain;

removing a portion of said insulating layer to form a gate opening between the local interconnects;

forming a gate oxide on the semiconductor substrate in the gate opening; and forming a gate on the gate oxide in gate opening between the local interconnects wherein the gate is selected from the group of polysilicon, refractory metal and metal.

16. In a method of fabricating, in an integrated circuit on a semiconductor substrate, a field effect transistor (FET) having a source, drain and gate and with one interconnect on each side of a gate of the FET comprising the steps of:

forming on a semiconductor substrate a thick insulating layer;

forming a pair of spaced apart openings in the insulating layer adjacent the semiconductor substrate, each opening being the size of a minimum lithographic feature;

forming a source in one of said openings and a drain in the other of the openings;

filling each of said openings with a conductive material to form local interconnects to the source and drain;

removing a portion of said insulating layer to form a gate opening of a minimum lithographic feature between the local interconnects;

forming a gate oxide on the semiconductor substrate in the gate opening; and forming a gate on the gate oxide in gate opening between the local interconnects, whereby the size of the FET transistor is three minimum lithographic features wherein openings in the insulating material is positioned over active regions in the semiconductor substrate and the opening in masking material extends to or beyond the active region on the sides of the opening removed from the local interconnects.

17. A field effect transistor (FET) in an integrated circuit comprising:

a pair of local interconnects spaced from each other by a minimum lithographic feature and each being a minimum lithographic feature;

a gate with an underlying gate oxide disposed in the space between the local interconnects and separated from each of the local interconnects by an insulating liner, whereby the size of the FET is not greater than three lithographic features wherein insulating spacers are disposed on the interconnect wall adjacent the gate to separate each of the local interconnects from the gate.

18. The field effect transistor (FET) in an integrated of claim 17 wherein a space between the pair of local interconnects is one minimum lithographic feature and the local interconnects are each one minimum lithographic feature.

19. The field effect transistor (FET) in an integrated circuit of claim 17 wherein the gate is selected from the group of polysilicon, refractory metal and metal.

20. The field effect transistor (FET) in an integrated circuit of claim 17 wherein the pair of local interconnects include a first conductive layer disposed in a U-shape and a second conductive layer disposed within the first conductive layer.

* * * * *